United States Patent [19]
Yoshida

[11] Patent Number: 6,011,292
[45] Date of Patent: *Jan. 4, 2000

[54] SEMICONDUCTOR DEVICE HAVING AN ALIGNMENT MARK

[75] Inventor: Tohru Yoshida, Warabi, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/858,879

[22] Filed: May 19, 1997

Related U.S. Application Data

[60] Continuation of application No. 08/469,904, Jun. 6, 1995, abandoned, which is a division of application No. 07/580,319, Sep. 10, 1990, Pat. No. 5,460,984.

[30] Foreign Application Priority Data

Sep. 11, 1989 [JP] Japan ................................. 1-232904

[51] Int. Cl.$^7$ .................... H01L 29/76; H01L 27/108; H01L 23/544
[52] U.S. Cl. ...................... 257/371; 257/301; 257/797
[58] Field of Search ................... 257/371, 797, 257/301

[56] References Cited

U.S. PATENT DOCUMENTS

| | | | |
|---|---|---|---|
| 3,212,162 | 10/1965 | Moore | 29/25.3 |
| 4,567,644 | 2/1986 | Allison | 29/576 B |
| 4,641,419 | 2/1987 | Kudo | 29/591 |
| 4,729,964 | 3/1988 | Natsuaki et al. | 257/371 |
| 4,795,716 | 1/1989 | Yilmaz et al. | 437/27 |
| 4,897,702 | 1/1990 | Sunouchi | 257/371 |
| 4,983,534 | 1/1991 | Kikuta | 437/31 |
| 5,374,838 | 12/1994 | Sawada et al. | 257/371 |

FOREIGN PATENT DOCUMENTS

| | | | |
|---|---|---|---|
| 57-37877 | 3/1982 | Japan | 257/371 |
| 60-105267 | 6/1985 | Japan | 257/369 |
| 60-138955 | 7/1985 | Japan | 257/369 |
| WO 87/05443 | 9/1987 | WIPO | 257/369 |

OTHER PUBLICATIONS

Nicollian et al., "MOS (Metal Oxide Semiconductor) Physics and Technology," 1982, pp. 718–721.

Pimbley et al., "VLSI Electronics Microstructure Science," vol. 19, Advanced CMOS Process Technology, 1989, pp. 145–147.

Iizuka et al., "Evolution of DRAM in Silicon MOS Technology, " VLSI and Computers First International Conference on Computer Technology, 1987, pp. 650–655.

Harris, Electronics Review, "Scaled–Down C–MOS May Catapult GE to Chip Forefront," vol. 56, No. 15, 1983, pp. 47–78.

Goodenough, Electronic Design, "Advances in Processing Grab Most of the Attention as IEDM's Program Unfolds," vol. 32, No. 24, 1984, pp. 73–100.

Campbell et al., IBM Technical Disclosure Bulletin, "Method for Forming N+—P+ Tunnel Junctions," vol. 25, No. 11B, 1983.

Ahlgren et al., IBM Technical Disclosure Bulletin, "Silicon Tunnel Diode Process for Bipolar Technology," vol. 25, No. 11B, 1983.

IBM Technical Disclosure Bulletin, "Recessed Oxide Isolation Process," vol. 28, No. 8, 1986.

*Primary Examiner*—Steven H. Loke
*Attorney, Agent, or Firm*—Foley & Lardner

[57] ABSTRACT

A semiconductor device with an alignment mark has a first well of a first conductivity type formed on the entire surface of a semiconductor substrate, a second well of a second conductivity type opposite to the first conductivity type formed within a desired region of the first well, and an oxide film formed on said first well and said second well, the first well having a higher impurity concentration than that of the semiconductor substrate, the depth of the first well being greater than that of said second well, and the oxide film having a step-wise alignment mark at a boundary between the first well and the second well.

7 Claims, 4 Drawing Sheets

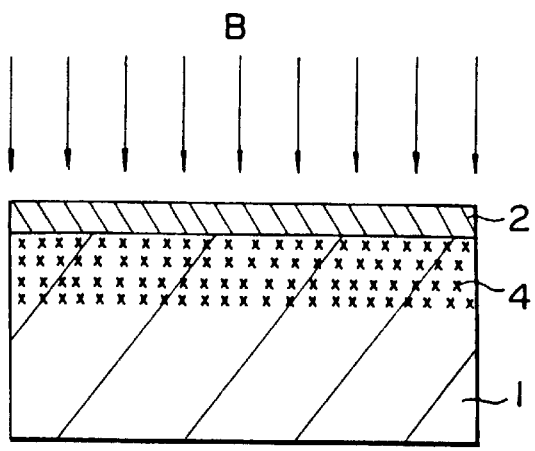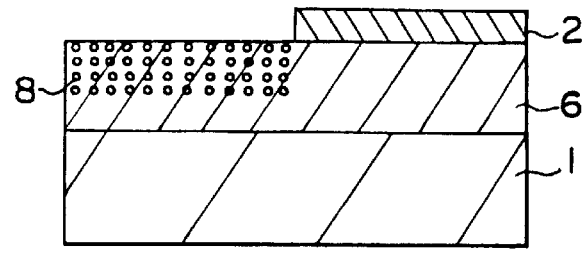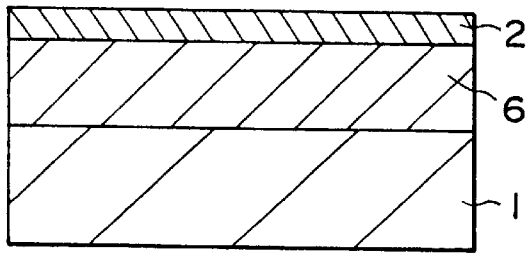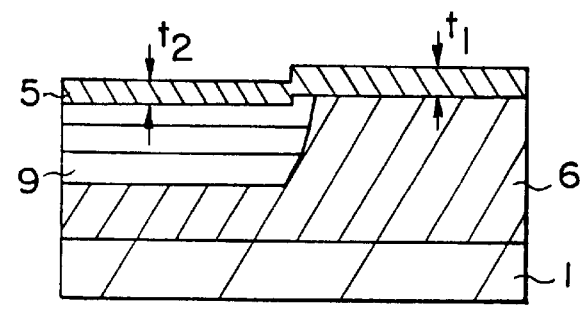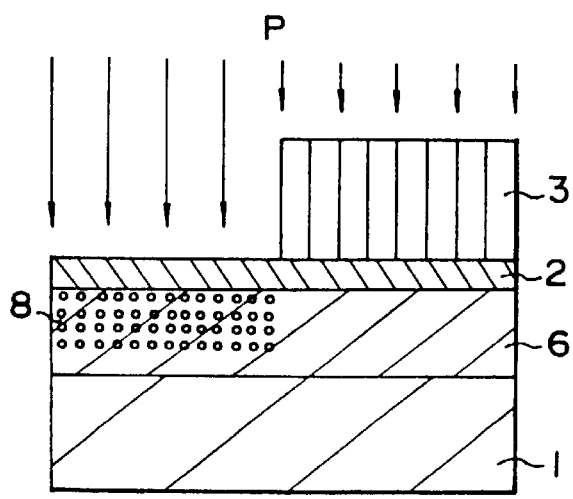
FIG. 1A
FIG. 1B
FIG. 1C
FIG. 1D
FIG. 1E

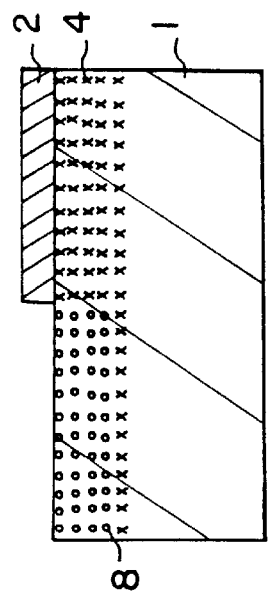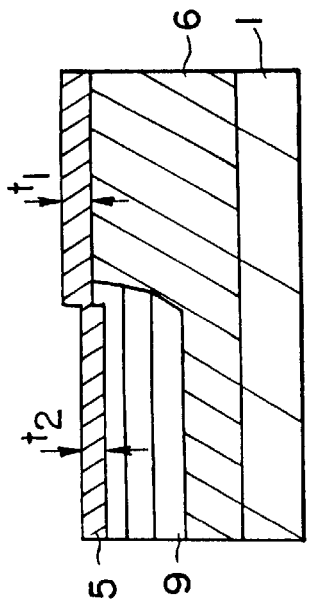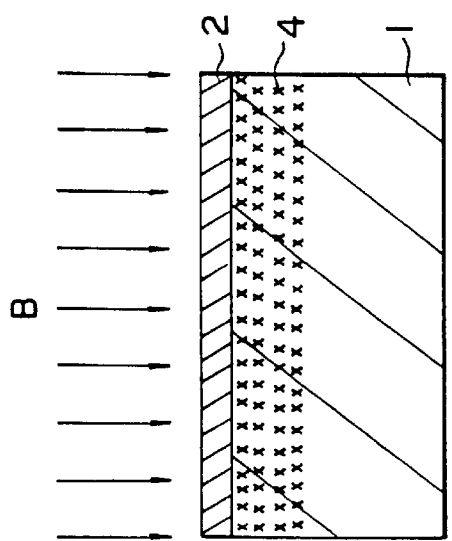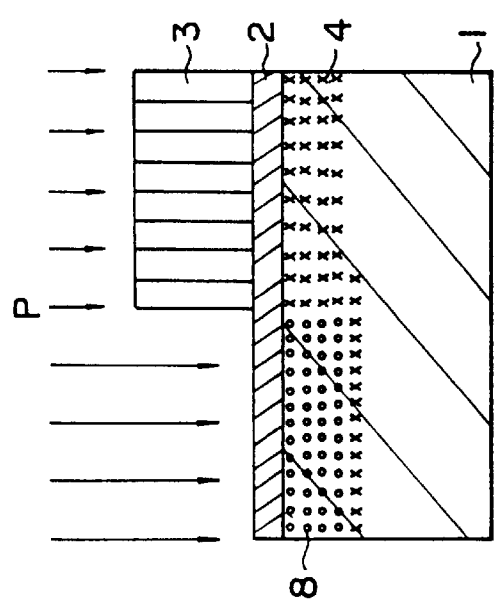

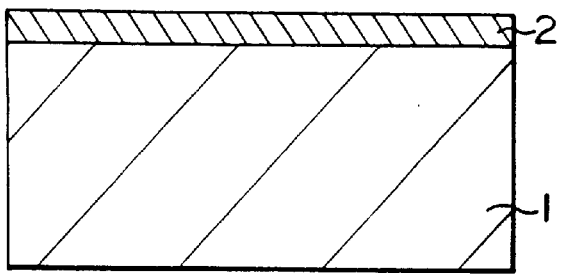
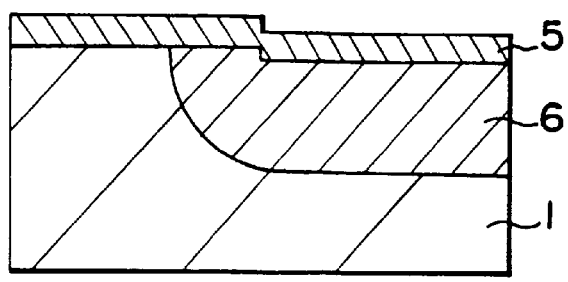
FIG. 4A    FIG. 4D
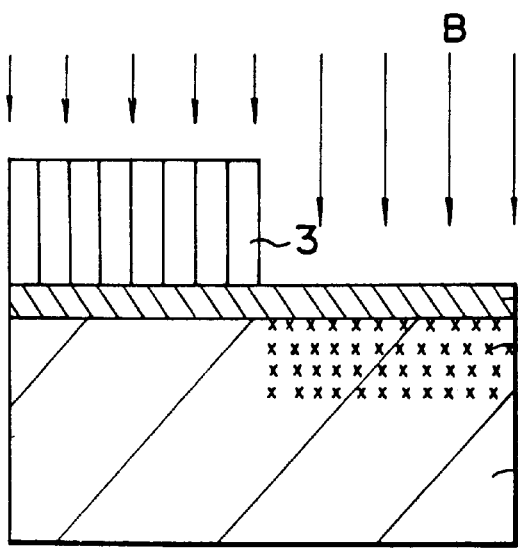
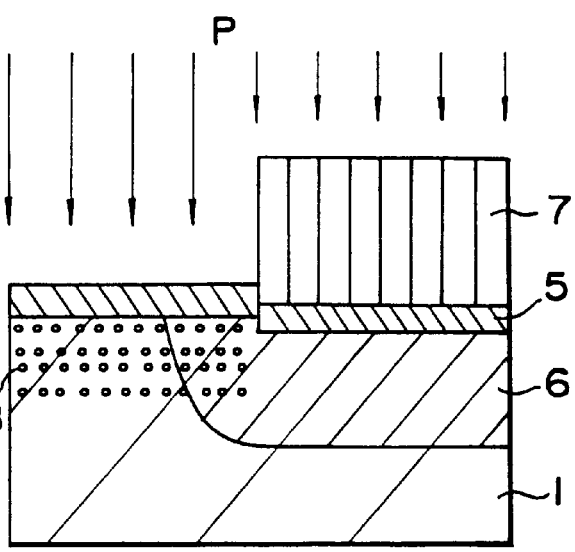
FIG. 4B    FIG. 4E
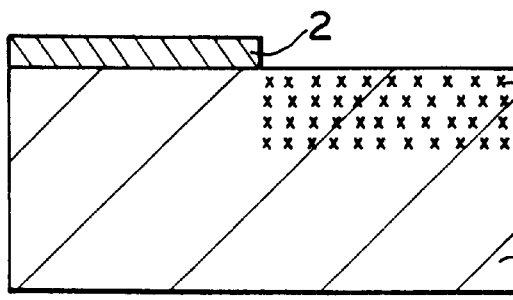
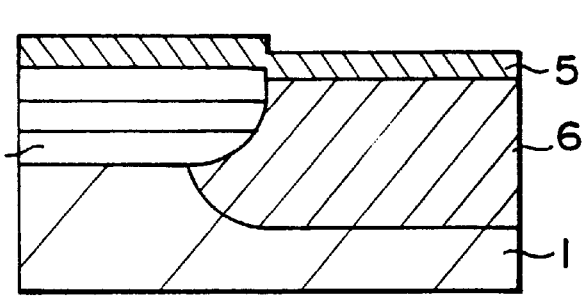
FIG. 4C    FIG. 4F
PRIOR ART

SEMICONDUCTOR DEVICE HAVING AN ALIGNMENT MARK

This application is a continuation, of application Ser. No. 08/469,904, filed Jun. 6, 1995, now abandoned, which is a division of application Ser. No. 07/580,319, filed Sep. 10, 1990, now U.S. Pat. No. 5,460,984.

BACKGROUND OF THE INVENTION

The present invention relates to a semiconductor device and a method of manufacturing the same, and more particularly, to a complementary MOS integrated circuit with wells and a method of manufacturing the same.

As integrated circuits are miniaturized more and more, memories, such as DRAM memories, introduce a vertical structure more often than a conventional planar structure. Capacitors of a trench structure are therefore used in such DRAM memories. Various problems are encountered, however, in the manufacture of memories with trench capacitors. One problem is that the well is made deep in order to suppress leakage between trenches of shallow wells.

A conventional method of forming a twin well in a complementary CMOS integrated circuit (hereinafter simply called CMOS IC) will be described with reference to FIGS. 4A to 4F.

A p-type silicon substrate 1 having impurity condition of $1 \times 10^{15}$ to $5 \times 10^{15}$ cm$^{-3}$ is subjected to thermal oxidation under an oxygen atmosphere to form a first oxide film 2 having a thickness of 1000 angstroms (FIG. 4A).

A photoresist 3, deposited on the first oxide film 2, is selectively patterned so as to remain on an region where an n-type well is to be formed, in order to form a p-type well. By using this photoresist 3 as a mask, boron ions are injected. In this case, a first damage layer 4 is formed by inactive boron ions (FIG. 4B).

Next, in order to form an alignment mark to be used at the succeeding photoetching process, the oxide film 2 on the p-well region is removed using ammonium fluoride liquid (NH$_4$F) and using the photoresist 3 as a mask. Thereafter, the photoresist 3 is removed (FIG. 4C).

In order to form the alignment mark for the photoetching process, a p-type well 6 is formed through thermal diffusion of boron ions under oxidation atmosphere. In this case, since silicon ions of the exposed surface of the substrate and oxygen ions in the atmosphere react, as a result, the height of the exposed surface of the substrate reduces, and an oxide film 5 is formed at the same time on the p-type well so that a step or a level difference between oxide films is formed on the surface of the silicon substrate 1, of which the step is used as the alignment mark (FIG. 4D).

Next, a photoresist 7 is selectively patterned on the p-type well region. By using the patterned photoresist 7 as a mask, phosphorus ions are injected. In this case, a second damage layer 8 is formed by inactive phosphorus ions (FIG. 4E).

Next, after removing the photoresist 7, thermal diffusion is carried our for the purpose of activation of impurities and obtaining a desired diffusion depth, to thereby form an n-type well 9 and thus a twin well (FIG. 4F). Thereafter, a trench capacitor is formed on the semiconductor substrate by using suitable conventional manufacturing methods.

In the above conventional technique, thermal diffusion under an oxygen atmosphere for the exposed p-type well region on the silicon substrate 1, for example, at step shown in FIG. 4C, may cause Oxidation-induced Staking Faults (OSF). OSFs occur more often in a p-type boron ion injection region than in an n-type phosphorus ion injection region, and increase in proportion with the ion injection dosage. In addition, in forming trench capacitors in DRAM memories, as described previously, it is necessary to form a deep p-type well region in order to suppress leakage between trenches. In order to form a deep p-type well, it is necessary to increase the boron ion injection dose and form at first a p-type well, so that OSFs are likely to occur.

Furthermore, a process of patterning a photoresist is required to be carried out twice in forming a twin well, thereby posing an increased number of manufacturing processes.

SUMMARY OF THE INVENTION

It is therefore an object of this invention to provide a twin well of novel structure.

It is another object of this invention to provide a semiconductor device of high reliability by suppressing the occurrence of crystalline defects in the formation of a twin well.

It is a further object of this invention to provide a method of manufacturing a semiconductor device of high reliability by reducing the number of manufacturing steps.

According to the present invention, there is provided a semiconductor device having a first well of a first conductivity type formed on the entire surface of a semiconductor substrate and having a higher impurity concentration than that of the semiconductor substrate and a second well of a second conductivity type opposite to the first conductivity type formed within a desired region of the first well, wherein the depth of the first well is greater than that of the second well.

According to the present invention, there is also provided a method of manufacturing a semiconductor device comprising the steps of: forming an oxide film on the surface of a semiconductor substrate, and thereafter injecting ions of a first conductivity type on the entire surface of the semiconductor substrate; forming a first well through a first thermal diffusion; injecting ions of a second conductivity type through the oxide film into a region where a second well is to be formed within the first well; and removing the oxide film formed on the second well region, and thereafter forming a second well having a depth smaller than that of the first well.

According to the present invention, there is further provided a method of manufacturing a semiconductor device comprising the steps of: forming an oxide film on the surface of a semiconductor substrate, and thereafter injecting ions of a first conductivity type on the entire surface of the semiconductor substrate; selectively injecting ions of a second conductivity type into a predetermined region, the injection of the second conductivity type ions being shallower than that of said first conductivity type ions; removing the oxide film formed on the surface of said predetermined region; and forming through thermal diffusion a second well of the second conductivity type ions within a first well of the first conductivity type ions, the depth of the first well being greater than that of the second well.

Semiconductor devices according to the present invention can considerably reduce leakage between trenches of trench capacitors. According to the method of manufacturing a semiconductor device of this invention, crystalline defects in the formation of a twin well can be effectively suppressed.

BRIEF DESCRIPTION OF THE DRAWINGS

FIGS. 1A to 1E are cross sections illustrating the manufacturing processes for a semiconductor device according to the present invention;

FIGS. 2A to 2D are cross sections illustrating the manufacturing processes according to a second embodiment of this invention;

FIGS. 4A to 4F are cross sections illustrating the manufacturing processes for a conventional semiconductor device.

DESCRIPTION OF THE PREFERRED EMBODIMENT

Figure 3:
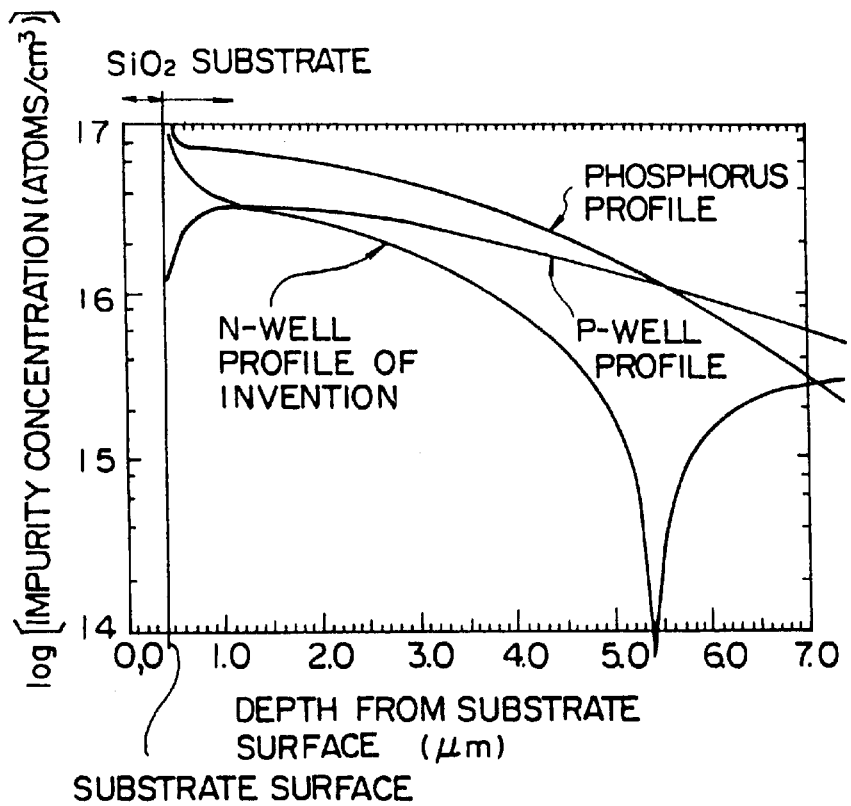
FIG. 3 shows the profile of impurities in an N-type well according to the present invention.

A semiconductor according to an embodiment of this invention is shown in FIG. 1E.

On a p-type silicon substrate (1 to $5 \times 10^{15}$ cm$^{-3}$ impurity concentration), there are formed a first well 6 (p-type well region, $3 \times 10^{16}$ cm$^{-3}$) and a second well 9 (n-type well region, $6 \times 10^{16}$ cm$^{-3}$). The surface of the substrate is formed with an oxide film 5 (SiO$_2$). The depth of the first well is about 10 microns, and the depth the second well is about 5 microns. The depth of the first well is two times the depth of the second well. A trench capacitor formed in such semiconductor device (e.g., DRAM) has a depth of 3 to 5 microns so that leakage between trenches is quite small.

The method of manufacturing such a semiconductor device of this embodiment will be described with reference to FIGS. 1A to 1E.

A p-type silicon substrate 1 is subjected to thermal oxidation under oxygen atmosphere to form an oxide film 2 having a thickness of 1000 angstroms. Thereafter, boron ions are injected over the entire surface of the p-type silicon substrate 1 through the oxide film 2, under the conditions that the injection energy is 150 keV and the dose is $1.5 \times 10^{13}$ cm$^{-2}$. In this case, a damage layer 4 is formed by boron ion injection (FIG. 1A).

In order to form a first well 6 (p-type well region), thermal diffusion (1190° C., 200 minutes) is carried out under oxygen atmosphere. During this thermal diffusion, the surface of the first damage layer 4 on the silicon substrate 1 is covered with the oxide film 2 so that OSFs will not occur even during the thermal oxidation under oxygen atmosphere (FIG. 1B).

Next, a photoresist 3 is selectively patterned to cover the region other than the region where a well is to be formed. By using this photoresist 3 as a mask, phosphorus ions are injected, under the conditions that the injection energy is 150 keV and the injection dose is $2.5 \times 10^{13}$ cm$^{-2}$. A damage layer 8 is formed by inactive phosphorus (FIG. 1C).

Next, in order to form an alignment mark to be used at the succeeding photoetching process, the oxide film 2 on the n-well region is etched using ammonium fluoride liquid (NH$_4$F) and using the patterned photoresist 3 as a mask. Thereafter, the photoresist is removed (FIG. 1D).

Next, thermal diffusion (1190° C., 480 minutes) is carried out for the purpose of activation of impurities and obtaining a desired diffusion depth, to thereby form a second well 9 (n-type well region) and thus a twin well (FIG. 1E). At this thermal diffusion, the surface of the substrate is further oxidized. As a result, a second oxide film 5 is formed on the surface of the second well 9.

Since phosphorus ions have been injected in the region which is to be the n-well, during thermal diffusion, the oxide film is formed on the surface of the region. At that time, silicon ions at the exposed surface of the substrate and oxygen ions in the atmosphere react to form silicon oxide film (second oxide film 5), as a result, the height of the exposed substrate surface is reduced. This height reduction produces a stepwise alignment mark at the boundary of the first oxide film and the second oxide film.

In the above manner, a twin well can be formed while suppressing occurrence of OSFs particularly in the region where p-type ions are injected.

In the above embodiment of this invention, the first thermal diffusion is carried out for forming a deep p-type well in a DRAM having a trench capacitor. For a DRAM without a trench capacitor (using a stacked capacitor or a planar capacitor), the first thermal diffusion is omitted and the second thermal diffusion is used for both p-type and n-type well diffusion. Specifically, after injecting boron ions (FIG. 2A), phosphorus ions are selectively injected (FIG. 2B) and thermal diffusion is carried out to thereby realize the structure (FIG. 2D) which is the same as shown in FIG. 1E.

Furthermore, although a twin well is formed in the embodiment, this invention is applicable to forming a triple, or threefold, well by forming the third well after forming the second well 9 in the similar manner described above. By repeating the above steps, a multiple well such as quadruple-well, quintuple-well and so on, may also be formed.

Although a p-type silicon substrate is used, the invention is also applicable to an n-type silicon substrate.

Furthermore, although the first well is of p-type and the second well is of n-type, this conduction type may be reversed.

Figure 5:
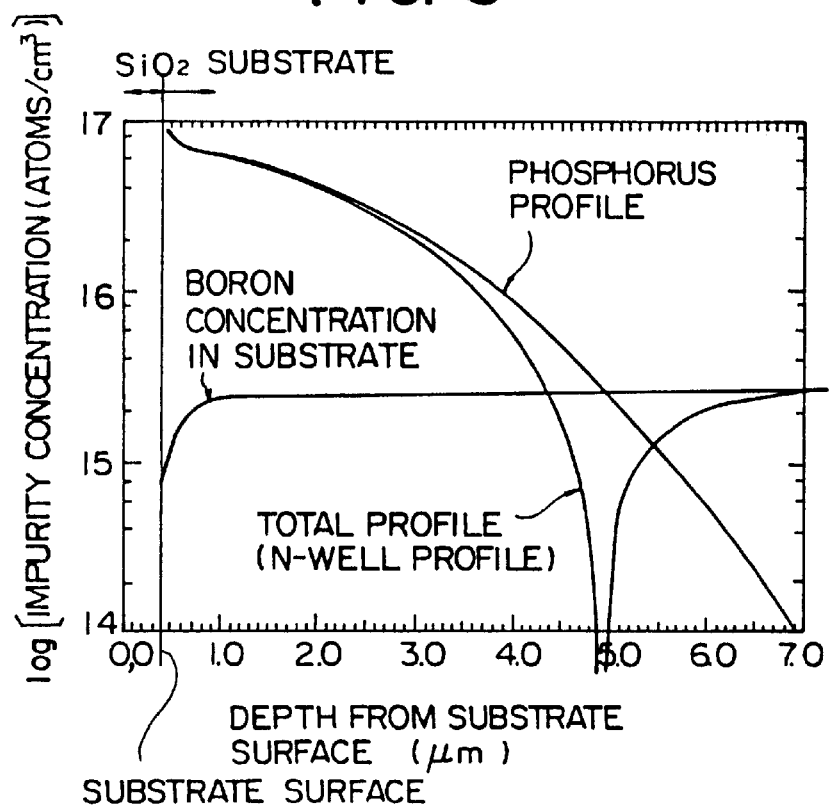
FIG. 5 shows the profile of impurities in a conventional N-type well.

As described in detail, according to the present invention, the profile of impurities in n-type well substantially the same as conventional n-type wells can be realized by properly setting the first thermal diffusion time, phosphorus ion injection conditions (acceleration energy, dose) for the formation of an n-type well region, and second thermal diffusion time. The profile of impurity concentration in an n-type well according to this invention is shown in FIG. 3, and the profile of impurity concentration in a conventional n-type well is shown in FIG. 5. As understood from FIGS. 3 and 5, both the profiles are substantially the same.

According to the present invention, in forming the p-type well, thermal diffusion is carried out while covering the surface of the silicon substrate 1 with the oxide film 2 so that the occurrence of OSFs can be suppressed in the order of 0.2/cm$^2$ and the pn-junction leakage can also be suppressed, allowing the formation of a semiconductor device of high quality and reliability.

Furthermore, in forming a twin well, the conventional method requires the two processes of patterning a photoresist, whereas the present invention requires one photoresist patterning process, thereby reducing the number of processes.

What is claimed is:

1. A semiconductor device comprising:
    a first well of a first conductivity type formed on an entire surface of a semiconductor substrate and having a higher impurity concentration than an impurity concentration of said semiconductor substrate;
    a second well of a second conductivity type enveloped by said first well, said first well including a first part having a depth and a second part having smaller depth from the bottom part of said first well to the bottom part of said second well;
    a first oxide film formed on said first well,
    a second oxide film formed on said second well, and a step-wise alignment mark formed in said first and second oxide films, said alignment mark being a level difference between said first oxide film on said second well and said second oxide film on said second well.

2. A semiconductor device according to claim 1, wherein said first well is a p-type impurity diffusion region and said second well is an n-type impurity diffusion region.

3. A semiconductor device according to claim 1, wherein the depth of said first well is sufficient for forming a trench capacitor.

4. A semiconductor device comprising:

a first well of a p-type formed on an entire surface of a semiconductor substrate and having a higher impurity concentration than an impurity concentration of said semiconductor substrate;

a second well of an n-type enveloped by said first well, a depth of said first well being greater than a depth of said second well; and a first oxide film formed on said first well;

a second oxide film formed on said second well; and a step-wise alignment mark formed in said first and second oxide films, said alignment mark being a level difference between said first oxide film on said second well and said second oxide film on said second well, said semiconductor device being a product of a process comprising the steps of:

forming said first oxide film on the surface of a bulk semiconductor substrate, and thereafter injecting ions of a p-type over the entire surface of said bulk semiconductor substrate;

performing a first heat treatment for forming said first well through a first thermal diffusion for activating said ions of the p-type;

forming a mask layer on said first oxide film, said mask layer having an aperture corresponding to a second well region where said second well is to be formed within said first well;

injecting ions of an n-type through said first oxide film into the second well region;

removing said mask layer and said first oxide film formed on said second well region; and performing a second heat treatment for diffusing said ions of the n-type to form said second well having a depth smaller than that of said first well and to form said second oxide film on said second well, the level difference between said first oxide film and said second oxide film being the step-wise alignment mark.

5. A semiconductor device according to claim 4, wherein said first well of said p-type is a boron diffused region and said second well of said n-type is a phosphorous diffused region.

6. A semiconductor device according to claim 4, wherein said first well is a p-type impurity diffusion region and said second well is an n-type impurity diffusion region.

7. A semiconductor device according to claim 4, wherein said first well has a depth sufficient for forming a trench capacitor.

* * * * *